United States Patent
Zhu et al.

(10) Patent No.: US 10,535,753 B2
(45) Date of Patent: Jan. 14, 2020

(54) METHOD OF MANUFACTURING A BIPOLAR TRANSISTOR WITH TRENCH STRUCTURE

(71) Applicant: Shanghai Huali Microelectronics Corporation, Shanghai (CN)

(72) Inventors: Qiaozhi Zhu, Shanghai (CN); Wei Liu, Shanghai (CN)

( * ) Notice: Subject to any disclaimer, the term of this patent is extended or adjusted under 35 U.S.C. 154(b) by 0 days.

(21) Appl. No.: 16/427,356

(22) Filed: May 31, 2019

(65) Prior Publication Data

US 2019/0319115 A1  Oct. 17, 2019

Related U.S. Application Data

(62) Division of application No. 15/944,801, filed on Apr. 4, 2018, now Pat. No. 10,347,753.

(30) Foreign Application Priority Data

Dec. 19, 2017 (CN) .......................... 2017 1 1374117

(51) Int. Cl.

| H01L 21/8222 | (2006.01) |
| H01L 29/66 | (2006.01) |
| H01L 21/02 | (2006.01) |
| H01L 29/165 | (2006.01) |
| H01L 29/08 | (2006.01) |
| H01L 29/78 | (2006.01) |

(52) U.S. Cl.
CPC .... *H01L 29/66636* (2013.01); *H01L 21/0243* (2013.01); *H01L 21/0245* (2013.01); *H01L 21/0251* (2013.01); *H01L 21/02447* (2013.01); *H01L 21/02529* (2013.01); *H01L 21/02532* (2013.01); *H01L 29/0847* (2013.01); *H01L 29/165* (2013.01); *H01L 29/7848* (2013.01)

(58) Field of Classification Search
CPC ............ H01L 21/28518; H01L 21/762; H01L 21/76205; H01L 21/76232; H01L 21/76235; H01L 21/8222; H01L 21/8224
See application file for complete search history.

(56) References Cited

U.S. PATENT DOCUMENTS

2017/0179220 A1\* 6/2017 Koricic .................. H01L 29/063

\* cited by examiner

*Primary Examiner* — Hoai V Pham
(74) *Attorney, Agent, or Firm* — Kilpatrick Townsend & Stockton, LLP

(57) ABSTRACT

The present disclosure relates to a semiconductor structure and a manufacturing process therefor. Provided is a method for manufacturing a bipolar transistor with a trench structure, including providing a semiconductor substrate; fabricating a shallow trench isolation structure to define a device active area; forming an N-type well and a P-type well in the active area to define a first region, a second region and a third region of the bipolar transistor; etching a portion, adjacent to the shallow trench isolation structure, in the first region to form a trench; performing ion implantation to form an emitter, a base and a collector of the bipolar transistor; forming a salicide block structure in the trench; and forming a metal electrode of the bipolar transistor, wherein the emitter is formed in the first region. The present disclosure further provides a bipolar transistor with a trench structure.

8 Claims, 7 Drawing Sheets

METHOD OF MANUFACTURING A BIPOLAR TRANSISTOR WITH TRENCH STRUCTURE

CROSS-REFERENCES TO RELATED APPLICATIONS

The present application is a division of U.S. application Ser. No. 14/879,057, filed Oct. 8, 2015, entitled "BIPOLAR TRANSISTOR WITH TRENCH STRUCTURE", which claims priority to Chinese Patent Application No. 201711374117.6, filed on Dec. 19, 2017, entitled "BIPOLAR TRANSISTOR WITH TRENCH STRUCTURE AND MANUFACTURING METHOD THEREOF", which is incorporated by reference herein for all purposes.

TECHNICAL FIELD

The present disclosure relates to a bipolar transistor structure and a manufacturing method therefor, and more particularly to a bipolar transistor structure with a trench structure and a manufacturing method thereof.

BACKGROUND

Since the invention of integrated circuits by Dr. Jack Kilby of Texas Instruments in early years, scientists and engineers have made numerous inventions and improvements in semiconductor devices and processes. In the past 50 years, the size of semiconductor devices has been significantly reduced, which leads to increasing processing speed and decreasing power consumption. To date, the development of semiconductors has generally followed Moore's Law, which roughly states that the number of transistors in dense integrated circuits doubles roughly every two years. Now, the semiconductor processes are being developed toward 20 nm or less, and some of the companies are embarking on the 14 nm process. Here, by way of providing only one reference, a silicon atom is about 0.2 nm, which means that the distance between two separate components manufactured by means of a 20 nm process is only about one hundred silicon atoms.

The manufacturing of semiconductor devices has therefore become increasingly challenging and advancing toward the physically possible limit. One of the recent developments in semiconductor technology has been the use of silicon germanium (SiGe) in semiconductor manufacturing. With the evolution of integrated circuit developments, functional densities (e.g., the number of interconnection line elements per chip area) are also generally increasing while the geometrical dimensions (i.e., the smallest element or line that can be produced using a process) are reduced. This size reduction process often can provide benefits in terms of increasing production efficiency and reducing associated costs; however, the reduction in size also results in a relatively high power loss value, for which low power loss elements such as complementary metal oxide semiconductor transistors (CMOSs) are used to solve. At present, most of the common integrated circuits are implemented based on a CMOS process.

A band-gap reference voltage source, as a common integrated circuit, is widely used in analog, digital and digital-analog hybrid circuits to provide a high-precision reference voltage for IC chips. In current CMOS integrated circuit processes, the band-gap reference voltage source is generally designed based on parasitic bipolar transistors. In order to increase the current gain of a parasitic bipolar transistor in a CMOS integrated process, a conventional process technique usually leaves a salicide block (SAB) layer of a certain width at an emitter of the transistor, so that a metal silicide and an electrode cannot be formed in the layer. FIG. 1A shows a schematic structural diagram of a parasitic bipolar transistor NPN transistor in the prior art. As shown in FIG. 1A, the semiconductor structure in the prior art has a semiconductor substrate 101, a shallow trench isolation structure 102 (STI), a P-type well 103, an N-type well 104, and a first active area 105A, a second active area 105B and a third active area 105C separated by the shallow trench isolation structure 102 and the P-type and N-type wells, and an emitter 106A and an emitter electrode 106B are formed over the first active area, a base 107A and a base electrode 107B are formed over the second active area, and a collector 108A and a collector electrode 108B are formed over the third active area. A portion, adjacent to the STI structure 102, on an upper surface of the emitter 106A leaves an SAB region 109, so that the metal silicide and the electrode cannot be formed in the region. With the prior art above, the current gain of the bipolar transistor can be increased to some extent. However, due to the limited area of the emitter region and the limited area available for the SAB region 109, the rate of increase in the current gain of the parasitic bipolar transistor has also been greatly limited.

Meanwhile, as shown in FIG. 1B, since a topographically uneven region 110 will be formed in a corner region between the emitter region 106A of the first active area 105A and the STI structure 102 by means of a front-layer multi-step cleaning and etching process, the topographically uneven region will affect the area of the SAB region 109 and the electric field distribution of the transistor, resulting in a relatively poor stability of the current gain of the bipolar transistor.

For these reasons, there is a need for a new transistor structure and a manufacturing method therefor, so that the bipolar transistor for the band-gap reference voltage source has a wider current gain range and a more stable current gain.

SUMMARY OF THE INVENTION

A brief summary on one or more aspects is given below to provide the basic understanding of these aspects. The summary is not an exhaustive overview for all the conceived aspects, and is intended to neither point out all the critical or decisive factors for all the aspects nor define the scope of any or all of the aspects. Its only aim is to provide some concepts of one or more aspects in a simplified manner as the preface of the more detailed description given later.

In order to make the bipolar transistor for a band-gap reference voltage source have a wider current gain range and a more stable current gain, the present disclosure provides a method for manufacturing a bipolar transistor with a trench structure, which specifically comprises: providing a semiconductor substrate; fabricating a shallow trench isolation structure to define a device active area; forming an N-type well and a P-type well in the active area to define a first region, a second region and a third region of the bipolar transistor; etching a portion, adjacent to the shallow trench isolation structure, in the first region to form a trench; performing ion implantation to form an emitter, a base and a collector of the bipolar transistor; forming a metal silicide block structure in the trench; and forming a metal electrode of the bipolar transistor, and the emitter is formed in the first region.

In an embodiment of the method, one end of the trench is of the shallow trench isolation structure, and the shape of the other end thereof is adjusted according to a current gain required to be achieved by the transistor.

In an embodiment of the method, the other end of the trench has a right-angled structure.

In an embodiment of the method, the volume of the trench is proportional to the current gain required to be achieved by the transistor.

In an embodiment of the method, forming the salicide block structure comprises: depositing a salicide block dielectric in the trench and on a surface of the transistor; and etching the deposited transistor to remove the salicide block dielectric from a surface of each of the emitter, the base and the collector, leaving the salicide block dielectric in the trench.

In an embodiment of the method, the deposition of a salicide block dielectric uses a chemical vapour deposition process.

In an embodiment of the method, the salicide block dielectric is one or both of silicon dioxide and silicon nitride.

In an embodiment of the method, the deposited transistor is planarized by using one of dry etching, wet etching, or combined dry and wet etching processes.

The present disclosure further provides a bipolar transistor with a trench structure, including a semiconductor substrate; a first active area, a second active area and a third active area, the active areas being isolated from one another by a shallow trench isolation structure; a portion, adjacent to the shallow trench isolation structure, in an upper region of the first active area having a trench structure; an upper part of the first active area having an emitter, an upper part of the second active area having a base, and an upper part of the third active area having a collector; a salicide block structure being provided in the trench structure; and a surface of each of the emitter, the base and the collector having a metal electrode.

In an embodiment of the transistor, one end of the trench is of the shallow trench isolation structure, and the shape of the other end thereof is adjusted according to a current gain required to be achieved by the transistor.

In an embodiment of the transistor, the other end of the trench has a right-angled structure.

In an embodiment of the transistor, the volume of the trench is proportional to the current gain required to be achieved by the transistor.

In an embodiment of the transistor, the salicide block structure is a salicide block dielectric deposited in the trench and on a surface of the transistor; and the deposited transistor is etched to remove the salicide block dielectric from a surface of each of the emitter, the base and the collector, leaving the salicide block dielectric in the trench.

In an embodiment of the transistor, the salicide block dielectric is one or both of silicon dioxide and silicon nitride.

According to the bipolar transistor with a trench structure provided in the present disclosure, the trench structure is formed by etching a region, adjacent to the STI, of the emitter before the ion implantation is performed to form the collector, the base and the emitter of the transistor, and thus the uneven topography of a contact angle between the active region and the shallow trench isolation structure due to the front-layer process is eliminated. Moreover, the deposition of the salicide block dielectric in the trench structure enhances the stability of the current gain of the transistor while preventing the formation of the metal silicide and the electrode in the trench region in the subsequent process. Due to the SAB structure of the trench structure, the range of rate of increase in the current gain is substantially increased compared with the prior art. The rate of increase in the current gain can be effectively increased while ensuring the stability of the current gain, and the deficiencies in the prior art are overcome.

BRIEF DESCRIPTION OF THE DRAWINGS

FIG. 3A shows a bipolar transistor without an SAB structure, FIG. 3B shows a planar SAB bipolar transistor, and FIG. 3C shows a trench-type SAB bipolar transistor.

FIG. 4A shows a bipolar transistor without an SAB structure, FIG. 4B shows a planar SAB bipolar transistor, and FIG. 4C shows a trench-type SAB bipolar transistor.

DETAILED DESCRIPTION

The present disclosure relates to a semiconductor process and device. More specifically, an embodiment of the present disclosure provides a semiconductor device, comprising a trench structure, the trench structure being filled with an SAB salicide block structure. Other embodiments are also provided.

Note that in the case of use, the flags left, right, front, rear, top, bottom, forward, backward, clockwise and counter-clockwise, are used only for the purpose of convenience but not imply any specific fixed direction. In fact, they are used to reflect the relative position and/or direction between various parts of an object.

As used herein, the terms "over", "under", "between" and "on" refer to the relative position of this layer relative to the other layers. Likewise, for example, one layer that is deposited or placed over or under another layer may be in direct contact with another layer or may have one or more intermediate layers. In addition, one layer that is deposited or placed between layers may be in direct contact with these layers or may have one or more intermediate layers. In contrast, a first layer "on" a second layer is in contact with the second layer. In addition, a relative position of one layer relative to the other layers is provided (assuming that deposition, modification and film removal operations are performed relative to a starting substrate, regardless of the absolute orientation of the substrate).

As mentioned above, the manufacturing of semiconductor devices has become increasingly challenging and advancing toward the physically possible limit. One of the recent developments in semiconductor technology has been the use of silicon germanium (SiGe) in semiconductor manufacturing. With the evolution of integrated circuit developments, functional densities (e.g., the number of interconnection line elements per chip area) are also generally increasing while the geometrical dimensions (i.e., the smallest element or line that can be produced using a process) are reduced. This size reduction process often can provide benefits in terms of increasing production efficiency and reducing associated costs; however, the reduction in size also results in a relatively high power loss value, for which low power loss elements such as complementary metal oxide semiconductor transistors (CMOSs) are used to solve.

A band-gap reference voltage source is widely used in analog, digital and digital-analog hybrid circuits to provide a high-precision reference voltage for IC chips. In current CMOS integrated circuit processes, the band-gap reference voltage source is generally designed based on parasitic bipolar transistors. In order to increase the current gain of a parasitic bipolar transistor in a CMOS integrated process, a conventional process technique usually leaves a salicide block (SAB) layer of a certain width at an emitter of the transistor, so that a metal silicide and an electrode may not be formed in the layer.

Figure 1A:
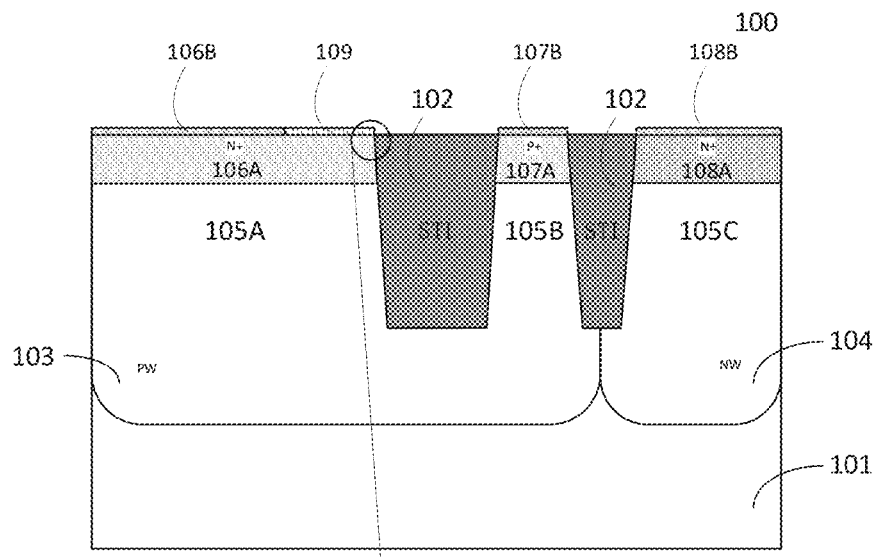
FIG. 1A shows a schematic structural diagram of a bipolar transistor NPN transistor in the prior art.

FIG. 1A shows a schematic structural diagram of a parasitic bipolar transistor NPN transistor in the prior art. As shown in FIG. 1A, the semiconductor structure in the prior art has a semiconductor substrate 101, a shallow trench isolation structure 102 (STI), a P-type well 103, an N-type well 104, and a first active area 105A, a second active area 105B and a third active area 105C separated by the shallow trench isolation structure 102 and the P-type and N-type wells, and an emitter 106A and an emitter electrode 106B are formed over the first active area, a base 107A and a base electrode 107B are formed over the second active area, and a collector 108A and a collector electrode 108B are formed over the third active area. A portion, adjacent to the STI structure 102, on an upper surface of the emitter 106A leaves an SAB region 109, so that the metal silicide and the electrode may not be formed in the region. With the prior art above, the current gain of the bipolar transistor can be increased to some extent. However, due to the limited area of the emitter region and the limited area available for the SAB region 109, the rate of increase in the current gain of the parasitic bipolar transistor has also been greatly limited.

Figure 1B:
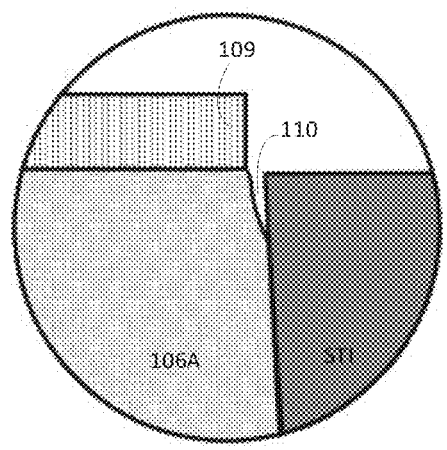
FIG. 1B shows a schematic diagram of a structural defect of the bipolar transistor NPN transistor in the prior art.

Meanwhile, FIG. 1B shows a schematic view of a structural defect of the parasitic bipolar transistor NPN transistor in the prior art. As shown in FIG. 1B, since a topographically uneven region 110 may be formed in a corner region between the emitter region 106A of the first active area 105A and the STI structure 102 by means of a front-layer multi-step cleaning and etching process, the topographically uneven region may affect the area of the SAB region 109 and the electric field distribution of the transistor, resulting in a relatively poor stability of the current gain of the bipolar transistor.

The present disclosure provides a method for manufacturing a bipolar transistor with a trench structure, in order to make the bipolar transistor for a band-gap reference voltage source have a wider current gain range and a more stable current gain.

FIGS. 2A-2H show simplified diagrams illustrating a process flow for providing a bipolar transistor NPN transistor with a trench structure according to an embodiment of the present disclosure. These diagrams provide examples only and should not unduly limit the scope of the claims. Depending on the implementation, one or more steps may be added, removed, repeated, rearranged, modified, replaced, and/or overlaid without affecting the scope of protection of the claims. In some embodiments, the manufacturing process flow of a bipolar transistor PNP transistor is similar to that of the NPN transistor.

Figure 2A:
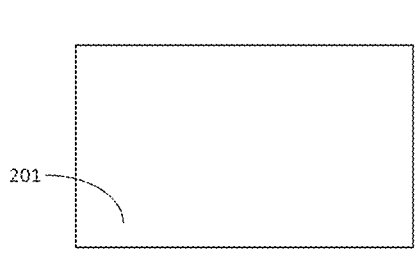
FIGS. 2A-2H show schematic structural diagrams of a transistor in a manufacturing process according to an embodiment of the present disclosure.

As shown in FIG. 2A, a semiconductor substrate 201 used in the present disclosure is firstly provided. The substrate 201 may be a semiconductor wafer such as a silicon wafer. Alternatively or additionally, the substrate 201 may include an elemental semiconductor material, a compound semiconductor material, and/or an alloyed semiconductor material. Instances of the elemental semiconductor material may be, but not limited to, crystalline silicon, polycrystalline silicon, amorphous silicon, germanium, and/or diamond. Instances of the compound semiconductor material may be, but not limited to, silicon carbide, gallium arsenide, gallium phosphide, indium phosphide, indium arsenide, and/or indium antimonide. Instances of the alloyed semiconductor material may be, but not limited to, SiGe, GaAsP, AlInAs, AlGaAs, GaInAs, GaInP, and/or GaInAsP.

Figure 2B:
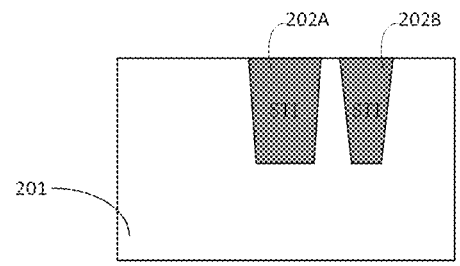

FIG. 2B shows that isolation components 202A and 202B are formed in the substrate 201. In this embodiment, the isolation components used in the present disclosure are subjected to a shallow trench isolation (STI) process, the shallow trench isolation process STI including but not limited to shallow trench etching, oxide filling and oxide planarization. The shallow trench etching includes, but not limited to, oxide layer isolation, nitride precipitation, shallow trench isolation using a mask, and STI shallow trench etching. The STI oxide filling includes, but not limited to, trench liner silicon oxide, trench CVD (chemical vapour deposition) oxide filling, or PVD (physical vapour deposition) oxide filling. The planarization of the surface of a silicon wafer can be achieved by a variety of methods. The planarization of the silicon wafer can be achieved by filling the gap with SOG (spin-on-glass). The SOG may be composed of a solvent of 80% and silicon dioxide 20%, the SOG is baked after deposition, the solvent is evaporated and the silicon dioxide is left in the gap, or the reverse engraving of all the surfaces may be carried out to reduce the thickness of the entire silicon wafer. The planarization processing may also be effectively performed by means of a CMP process (also referred to as polishing process), including, but not limited to, polishing trench oxide (chemical mechanical polishing may be used) and removing nitride.

Figure 2C:
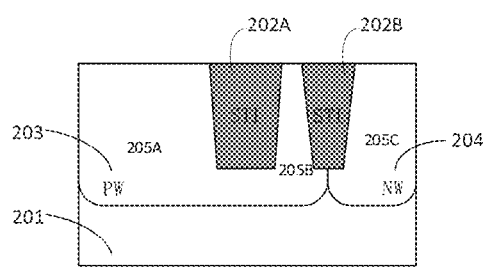

FIG. 2C shows that ion implantation is performed in the substrate 201 to form an N-type well and a P-type well of a transistor. Because of the NPN transistor forming the bipolar transistor provided in the present disclosure, the P-type well 203 and the N-type well 204 are separated by a shallow trench 202B, a first active area 205A and a second active area are formed in the P-type well portion and are separated by a shallow trench 202A, and a third active area 205C is formed in the N-type well 204 portion. The formation of each well comprises at least three to five steps to complete the fabrication, including but not limited to epitaxial growth, native oxide growth, ion implantation using a mask, and further high-energy ion implantation and annealing.

Figure 2D:
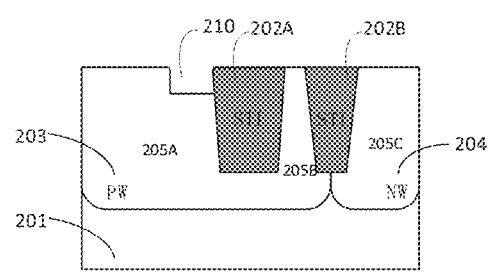

FIG. 2D shows a schematic diagram of a trench structure, adjacent to the STI trench 202A, on an upper part of the first active area 205A. The formation of a trench structure on the upper part of the first active area 205A may use a dry etching or wet corrosion process and/or other etching methods (e.g., reactive ion etching). One end of the trench 210 is adjacent to the shallow trench isolation structure 202A. The shape of the other end of the trench 210 can be adjusted according to the current gain required to be achieved by the transistor. In this embodiment, the other end of the trench 210 has a right-angled structure. The depth and width of the trench 210 can be adjusted according to the current gain actually required to be achieved by the transistor. The volume of the trench 210 is proportional to the current gain required to be achieved by the transistor. The larger the volume of the trench 210, the larger the current gain that can be achieved by the transistor. By means of the process of forming the trench structure 210, a topographically uneven corner region 110 in the prior art due to the front-layer multi-step cleaning and etching process can be removed, so as to reduce the defects of devices in the prior art.

Figure 2E:
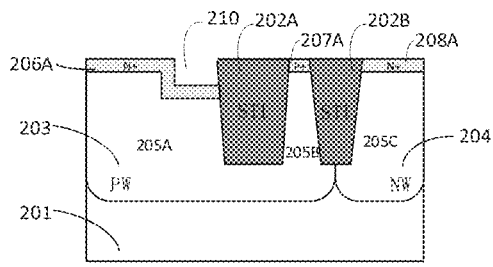

FIG. 2E shows a schematic diagram of performing ion implantation on upper parts of the first active area 205A, the second active area 205B and the third active area 205C and forming an emitter 206A, a base 207A and a collector 208A of the transistor. In this embodiment, the emitter 206A is N-type doped, and may have a dopant, such as arsenic (As), phosphorus (P), other group V elements, or a combination thereof. The base 207A is P-type doped, and may have a dopant, such as boron (B) or other group III elements. The collector 208A is N-type doped, and may have a dopant, such as arsenic (As), phosphorus (P), other group V elements, or a combination thereof. In other embodiments, source/drain areas may include silicide to achieve low resistance, and the materials of the silicide may include, for example, NiSi, NiPtSi, NiPtGeSi, NiGeSi, YbSi, PtSi, IrSi, ErSi, CoSi, other suitable materials, and/or a combination thereof.

Figure 2F:
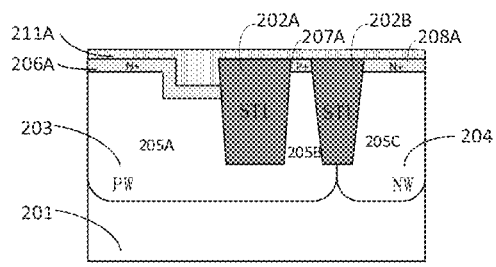
Figure 2G:
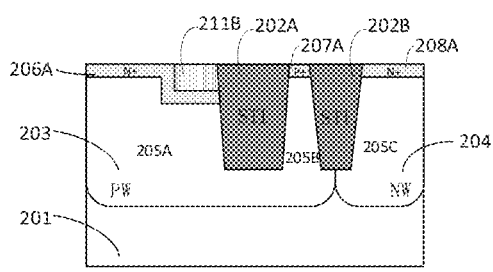

FIGS. 2F-G show schematic diagrams of forming a salicide block structure 211B in the trench 210. Firstly, a layer of salicide block dielectric 211A is deposited on a semiconductor substrate 201, as shown in FIG. 2F, and the deposited SAB dielectric 211A fills up the trench 210 and uniformly covers the substrate 201. Subsequently, the SAB dielectric uniformly covering the surface of the substrate 201 is removed by means of an etching process, leaving the SAB dielectric 211B remaining in the trench 210. The above-mentioned deposition process includes, but not limited to, chemical vapour deposition (CVD), physical vapour deposition (PVD), atomic layer deposition (ALD), high-density plasma CVD (HDPCVD), metal organic CVD (MOCVD), or plasma enhanced CVD (PECVD) for forming the SAB dielectric layer 211A. The above-mentioned etching process includes, but not limited to, a dry etching or wet corrosion process and/or other etching methods (e.g., reactive ion etching). The SAB salicide block dielectric includes, but is not limited to, silicon dioxide and silicon nitride.

By means of forming a trench in a portion, near the shallow trench isolation (STI) structure 202A, in the first active area 205A and filling the metal silicide barrier dielectric therein, a metal electrode may not be formed on the surface of the trench 210 in the subsequent process due to the presence of the SAB dielectric. Since the region where the metal electrode may not be formed in this portion is in an emitter region of the transistor, the skin effect of the current concentrates part of the emitter current near an SAB dielectric region, so as to neutralize part of the base region current to achieve the effect of increasing the current gain of the transistor. At the same time, since the SAB dielectric of the bipolar transistor with a trench structure provided in the present disclosure is formed in a trench etched in advance, the volume of the SAB dielectric is consistent with that of the trench and can be controlled by using process parameters to make the SAB dielectric region larger, so that more skin currents would be gathered around the SAB region. Therefore, the corresponding base region current that can be neutralized is larger and the composite current in the base region is reduced, so that the current gain of the transistor is increased. At the same time, by means of controlling the width and depth of the etched trench, the SAB region can be adjusted, and the current gain of the transistor is controllably adjusted accordingly.

Figure 2H:
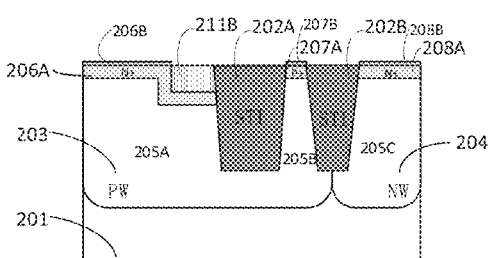

FIG. 2H shows a schematic structural diagram of an embodiment of a transistor provided in the present disclosure. As shown in FIG. 2H, the subsequent formation of a metal electrode on the transistor after the SAB salicide block structure 211B is formed includes, but not limited to, metal contact forming silicide contact tightly bonding the metal and the silicon, local interconnections forming a metal connection line between a transistor and a contact, depositing a dielectric using an interlayer dielectric and fabricating a through hole to connect the locally interconnected metal and a metal layer, depositing a metal sandwich structure using a metal for metal etching and imprinting the layer of metal, depositing a second layer of interlayer dielectric and the through hole and depositing a metal superimposed structure, depositing and etching a third layer of interlayer dielectric, and point-by-point etching and alloying repeated filming process until the deposition of a metal pad is completed and so on.

As described above, according to the bipolar transistor with a trench structure provided in the present disclosure, since the trench structure is formed between the emitter and the shallow trench isolation structure and the salicide block dielectric is formed therein, the metal electrode may not be formed subsequently in the above-mentioned region, and part of the emitter current is gathered around the SAB trench region by means of the skin effect of the current to neutralize part of the current in a base region, so as to increase the current gain of the transistor. In addition, because of the etching of the trench, the topographically uneven area of the corner region of the STI structure originally caused by the front-layer multi-step cleaning and etching process is removed, so that the electric field distribution of the transistor is more uniform and the stability of the current gain is improved.

Figure 3A:
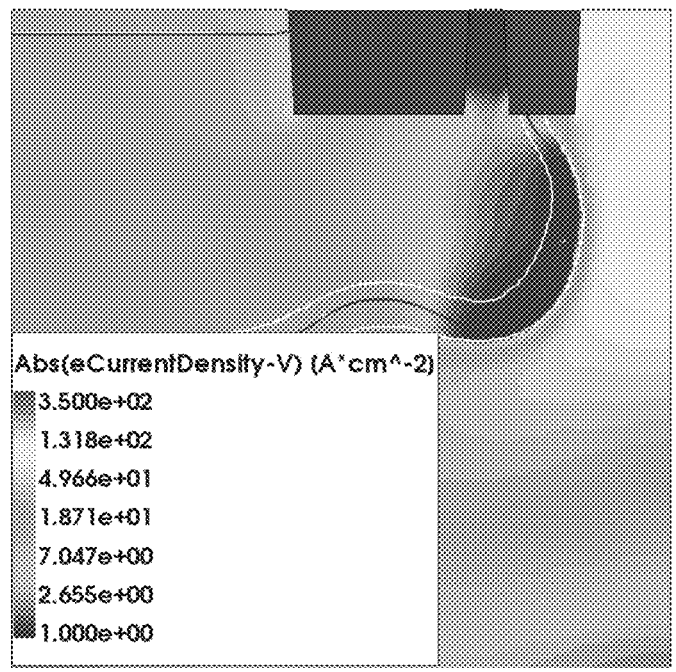
FIGS. 3A-3C show schematic diagrams for the electron current distribution comparison of a bipolar transistor.
Figure 3B:
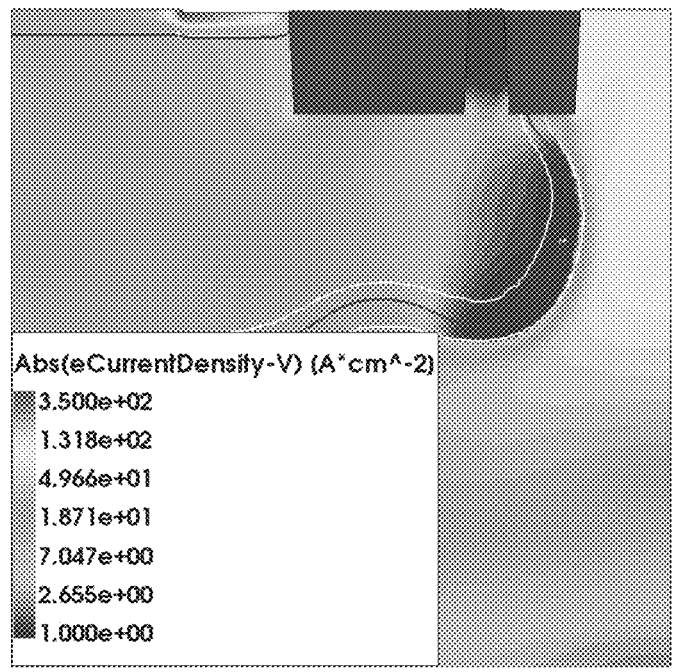
Figure 3C:
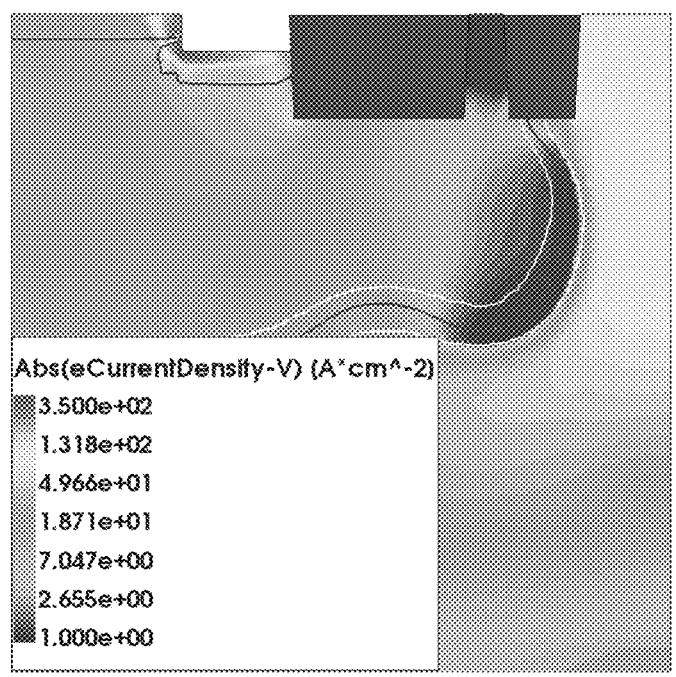

FIGS. 3A-3C show schematic diagrams for the electron current distribution comparison of a bipolar transistor, and FIG. 3A shows a bipolar transistor without an SAB structure, FIG. 3B shows a planar SAB bipolar transistor, and FIG. 3C shows a trench-type SAB bipolar transistor. As can be seen from the figures, no electrons are gathered in the emitter region of the bipolar transistor without an SAB structure as shown in FIG. 3A, whereas in the planar bipolar transistor shown in FIG. 3B, part of the electrons are gathered at the emitter of the SAB region but the amount of electrons gathered is limited by the size of the SAB region; and as shown in FIG. 3C, i.e. the SAB bipolar transistor with a trench provided in the present disclosure, a large amount of electrons are gathered in the emitter region and can neutralize the current in the base region, so that the current gain of the bipolar transistor is increased.

Figure 4A:
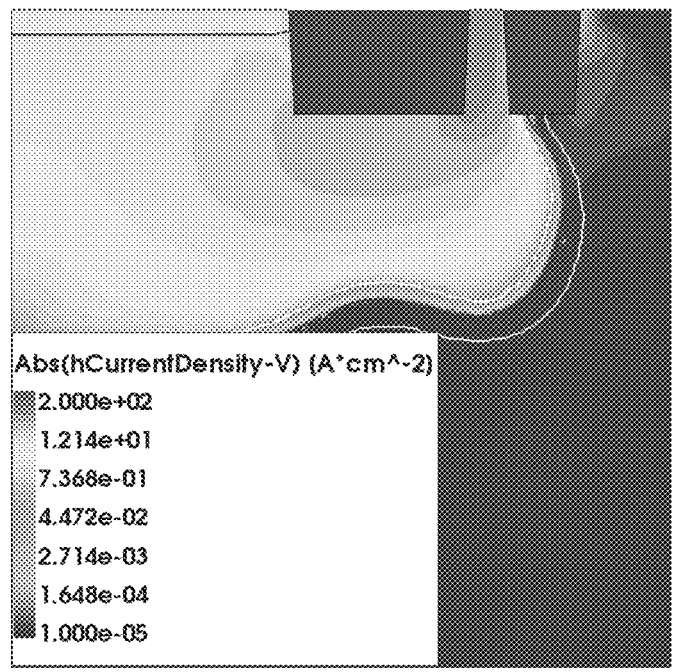
FIGS. 4A-4C show schematic diagrams for the hole current distribution comparison of a bipolar transistor.
Figure 4B:
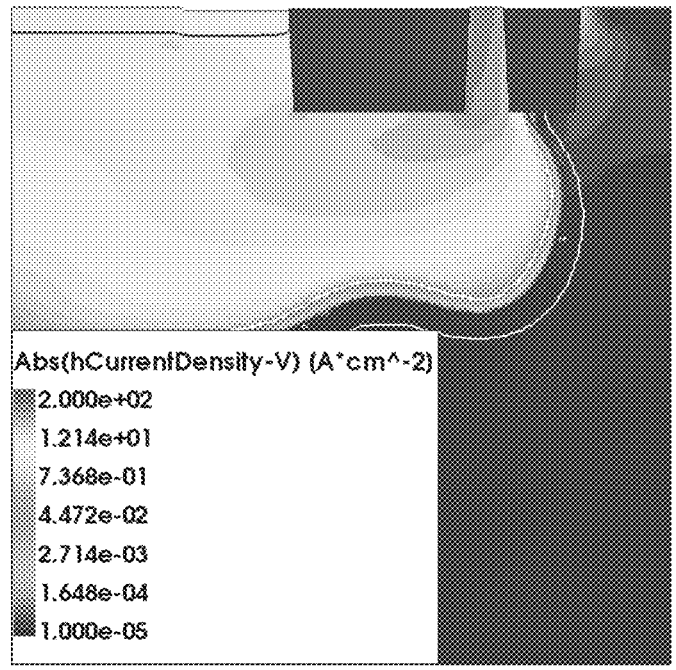
Figure 4C:
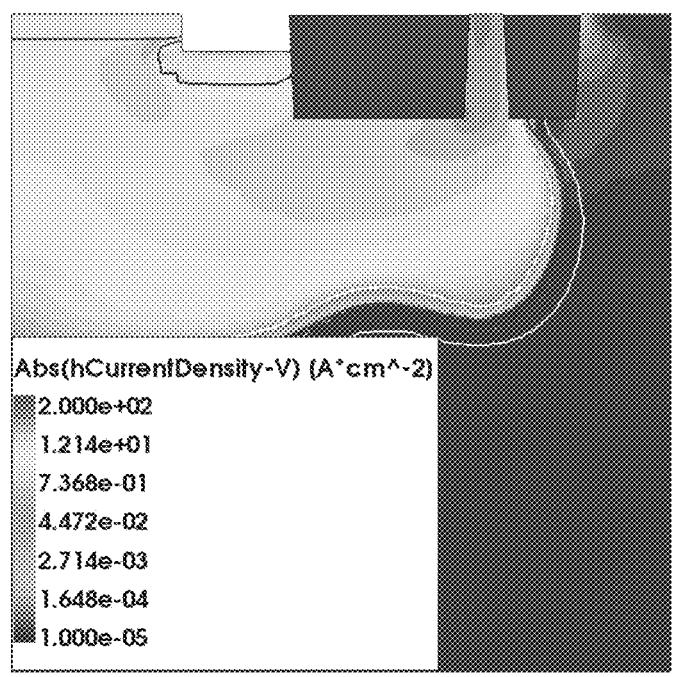

FIGS. 4A-4C show schematic diagrams for the hole current distribution comparison of a bipolar transistor, and FIG. 4A shows a bipolar transistor without an SAB structure, FIG. 4B shows a planar SAB bipolar transistor, and FIG. 4C shows a trench-type SAB bipolar transistor. As can be seen from the figure, since no electrons are gathered in the emitter region of the bipolar transistor without an SAB structure as shown in FIG. 3A, the hole current in the base region in FIG. 4A is relatively large, whereas in the planar bipolar transistor shown in FIG. 4B, part of the electrons are gathered at the emitter of the SAB region (shown in FIG. 3B). Therefore, in FIG. 4B, part of the hole current in the base region is neutralized, but is limited to the size of the SAB region due to the amount of the gathered electrons, and the amount of the neutralized hole current is also limited. As shown in FIG. 4C, i.e. the SAB bipolar transistor with a trench provided in the present disclosure, a large amount of electrons are gathered in the emitter region (shown in FIG. 3C) to neutralize most of the current in the base region, so that the current gain of the bipolar transistor is increased.

Figure 5:
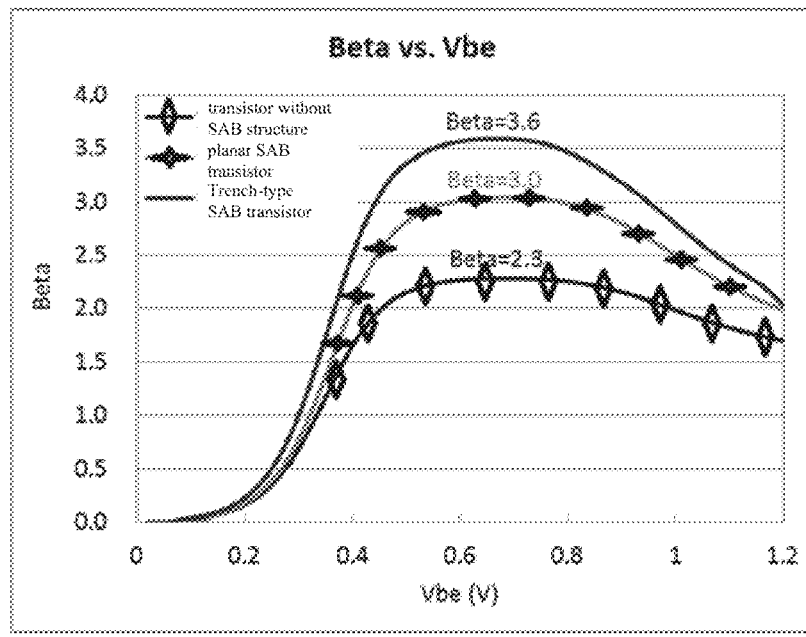
FIG. 5 shows a schematic diagram of the comparison of current gains of the bipolar transistor without an SAB structure, the planar SAB bipolar transistor and the trench-type SAB bipolar transistor.

FIG. 5 shows a schematic diagram of the comparison of current gains of the bipolar transistor without an SAB structure, the planar SAB bipolar transistor and the trench-type SAB bipolar transistor. With the rest of the conditions unchanged, the current gain without an SAB structure is 2.3 at the maximum whereas the current gain of the planar SAB transistor is 3.0 at the maximum. The current gain of the trench-type SAB transistor provided in the present disclosure is 3.6 at the maximum, higher than that of the transistor without an SAB and the planar SAB transistor, and can bring a greater current gain.

Figure 6:
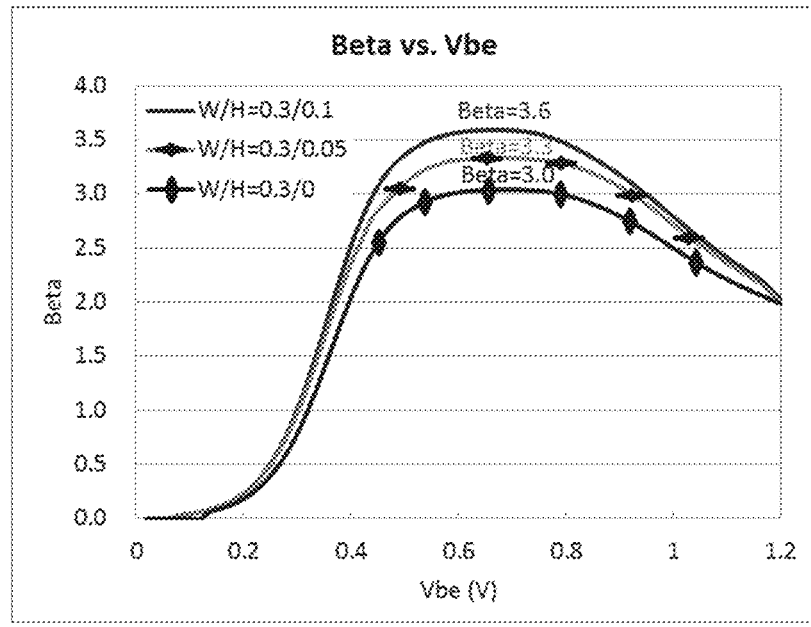
FIG. 6 shows a schematic diagram of the comparison of current gains of the trench-type SAB bipolar transistor with different widths and depths of the trench.

FIG. 6 shows a schematic diagram of the comparison of current gains of the trench-type SAB bipolar transistor with the determined width and different depths of the trench. As can be seen from the figure, when the widths of the trench are consistent, as the depth of the trench increases, the greater the current gain that the transistor can achieve. When the depth of the trench is 0, it is equivalent to the current gain that the planar SAB transistor can provide. Therefore, it can be understood that the shape of the trench can be adjusted according to the different current gains required to be achieved by the transistor, and the volume of the trench is proportional to the current gain required to be achieved by the transistor.

Hereto, a method for fabricating a bipolar transistor with a trench and embodiments of the structure thereof have been described. Although the present disclosure has been described with respect to some embodiments, it will be apparent that various modifications and changes can be made to these embodiments without departing from the broader spirit and scope of the present disclosure. Accordingly, the description and accompany drawings are to be regarded as the illustrative meaning rather than the restrictive meaning.

It is to be understood that this description is not intended to explain or limit the scope or meaning of the claims. In addition, in the foregoing detailed description, it can be seen that various features are combined together in a single embodiment for the purpose of streamlining the present disclosure. This method of the present disclosure should not be interpreted as reflecting the intention that the claimed embodiments require more features than those explicitly recited in each claim. On the contrary, as the following claims reflect, the inventive subject matter involves less than all features of a single disclosed embodiment. Therefore, the claims below are hereby incorporated into the detailed description, with each claim being a separate embodiment on its own.

An embodiment or embodiments mentioned in this description intends that a particular feature, structure, or characteristic described in connection with the embodiment is included in at least one embodiment of the circuit or method. The phrases "an embodiment" appearing in various places in the description do not necessarily all refer to the same embodiment.

What is claimed is:

1. A method for manufacturing a bipolar transistor with a trench structure, comprising:
    providing a semiconductor substrate;
    fabricating a shallow trench isolation structure to define a device active area;
    forming an N-type well and a P-type well in the active area to define a first region, a second region and a third region of the bipolar transistor;
    etching a portion, adjacent to the shallow trench isolation structure, on an upper part of the first region to form a trench;
    performing ion implantation to form an emitter, a base and a collector of the bipolar transistor;
    forming a salicide block structure in the trench; and
    forming a metal electrode of the bipolar transistor, wherein
    the emitter is formed in the first region.

2. The method of claim 1, wherein a first end of the trench is of the shallow trench isolation structure, and the shape of a second end is adjusted according to a current gain required to be achieved by the transistor.

3. The method of claim 2, wherein the second end of the trench has a right-angled structure.

4. The method of claim 1, wherein a volume of the trench is proportional to the current gain required to be achieved by the transistor.

5. The method of claim 1, wherein the forming of the salicide block structure comprises:
    depositing a salicide block dielectric in the trench and on a surface of the transistor; and
    etching the deposited transistor to remove the salicide block dielectric from a surface of each of the emitter, the base and the collector, leaving the salicide block dielectric in the trench.

6. The method of claim 5, wherein deposition of a salicide block dielectric uses a chemical vapour deposition process.

7. The method of claim 5, wherein the salicide block dielectric is one or more of: silicon dioxide and silicon nitride.

8. The method of claim 5, wherein the deposited transistor is etched by using one or more of: dry etching, wet etching, and combined dry and wet etching processes.

* * * * *